US012750939B2

(12) United States Patent
Ueda

(10) Patent No.: US 12,750,939 B2
(45) Date of Patent: Sep. 29, 2026

(54) EXTREME ULTRAVIOLET LIGHT GENERATION APPARATUS AND ELECTRONIC DEVICE MANUFACTURING METHOD

(71) Applicant: Gigaphoton Inc., Tochigi (JP)

(72) Inventor: Atsushi Ueda, Oyama (JP)

(73) Assignee: Gigaphoton Inc., Tochigi (JP)

( * ) Notice: Subject to any disclaimer, the term of this patent is extended or adjusted under 35 U.S.C. 154(b) by 104 days.

(21) Appl. No.: 18/976,843

(22) Filed: Dec. 11, 2024

(65) Prior Publication Data

US 2025/0234445 A1 Jul. 17, 2025

(30) Foreign Application Priority Data

Jan. 17, 2024 (JP) ................................ 2024-005282

(51) Int. Cl.

*G03F 7/20* (2006.01)
*G03F 1/22* (2012.01)
*G03F 7/00* (2006.01)
*H05G 2/00* (2006.01)

(52) U.S. Cl.

CPC ............ *H05G 2/0027* (2024.08); *G03F 1/22* (2013.01); *G03F 7/70033* (2013.01); *G03F 7/70525* (2013.01); *G03F 7/70933* (2013.01); *H05G 2/003* (2013.01); *H05G 2/0082* (2024.08)

(58) Field of Classification Search

CPC .... H05G 2/0027; H05G 2/003; H05G 2/0082; G03F 1/22; G03F 7/70033; G03F 7/70525; G03F 7/70933

See application file for complete search history.

(56) References Cited

U.S. PATENT DOCUMENTS

2010/0181498 A1* 7/2010 Someya .............. G03F 7/70841 250/492.1
2022/0082927 A1 3/2022 Hoshino et al.
2023/0074743 A1* 3/2023 Miyashita ........... G03F 7/70141

FOREIGN PATENT DOCUMENTS

JP 2009-205952 A 9/2009

* cited by examiner

*Primary Examiner* — Mesfin T Asfaw

(74) *Attorney, Agent, or Firm* — Studebaker Brackett PLLC

(57) ABSTRACT

An extreme ultraviolet light generation apparatus includes a chamber including a first space and a second space; a first partition wall including a first opening through which extreme ultraviolet light passes; a connection portion connecting the chamber and an external apparatus; a second partition wall including a second opening through which the extreme ultraviolet light passes; a gas supply port which allows a gas to pass therethrough; a first exhaust port which opens to the first space; a second exhaust port which opens to a third space located inside the connection portion; a first sensor arranged in the third space; and a processor calculating a first passage flow rate of a gas passing through the first opening based on a measurement result of the first sensor and adjusting a supply flow rate of the gas to be supplied through the gas supply port based on the first passage flow rate.

20 Claims, 8 Drawing Sheets

FIG. 7

| | | | | |
|---|---|---|---|---|
| ΔP | $ΔP_1$ | $ΔP_2$ | ··· | $ΔP_N$ |
| M2 | $M2_1$ | $M2_2$ | ··· | $M2_N$ |

EXTREME ULTRAVIOLET LIGHT GENERATION APPARATUS AND ELECTRONIC DEVICE MANUFACTURING METHOD

CROSS-REFERENCE TO RELATED APPLICATIONS

The present application claims the benefit of Japanese Patent Application No. 2024-005282, filed on Jan. 17, 2024, the entire contents of which are hereby incorporated by reference.

BACKGROUND

1. Technical Field

The present disclosure relates to an extreme ultraviolet light generation apparatus and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10: nm or less will be required. Therefore, it is expected to develop a semiconductor exposure apparatus that combines an apparatus for generating extreme ultraviolet (EUV) light having a wavelength of about 13 nm with a reduced projection reflection optical system.

As the EUV light generation apparatus, a laser produced plasma (LPP) type apparatus using plasma generated by irradiating a target substance with laser light has been developed.

LIST OF DOCUMENTS

Patent Documents

Patent Document 1: US Patent Application Publication No. 2022/082927

Patent Document 2: Japanese Patent Application Publication No. 2009-205952

SUMMARY

An extreme ultraviolet light generation apparatus according to an aspect of the present disclosure includes a chamber including a first space in which a target is irradiated with laser light to generate extreme ultraviolet light, and a second space in which an EUV light concentrating mirror that reflects and outputs the extreme ultraviolet light to an external apparatus is arranged; a first partition wall including a first opening through which the extreme ultraviolet light passes and located between the first space and the second space; a connection portion which connects the chamber and the external apparatus; a second partition wall including a second opening through which the extreme ultraviolet light passes and located inside the connection portion; a gas supply port which allows a gas, to be supplied to the second space, to pass therethrough; a first exhaust port which opens to the first space; a second exhaust port which opens to a third space located inside the connection portion and between the second partition wall and the external apparatus; a first sensor arranged in the third space; and a processor configured to calculate a first passage flow rate of a gas passing through the first opening based on a measurement result of the first sensor and adjust a supply flow rate of the gas to be supplied through the gas supply port based on the first passage flow rate.

An electronic device manufacturing method according to an aspect of the present disclosure includes generating extreme ultraviolet light using an extreme ultraviolet light generation apparatus, outputting the extreme ultraviolet light to an exposure apparatus, and exposing a photosensitive substrate to the extreme ultraviolet light in the exposure apparatus to manufacture an electronic device. Here, the extreme ultraviolet light generation apparatus includes a chamber including a first space in which a target is irradiated with laser light to generate the extreme ultraviolet light, and a second space in which an EUV light concentrating mirror that reflects and outputs the extreme ultraviolet light to the exposure apparatus is arranged; a first partition wall including a first opening through which the extreme ultraviolet light passes and located between the first space and the second space; a connection portion which connects the chamber and the exposure apparatus; a second partition wall including a second opening through which the extreme ultraviolet light passes and located inside the connection portion; a gas supply port which allows a gas, to be supplied to the second space, to pass therethrough; a first exhaust port which opens to the first space; a second exhaust port which opens to a third space located inside the connection portion and between the second partition wall and the exposure apparatus; a sensor arranged in the third space; and a processor configured to calculate a first passage flow rate of a gas passing through the first opening based on a measurement result of the sensor and adjust a supply flow rate of the gas to be supplied through the gas supply port based on the first passage flow rate.

An electronic device manufacturing method according to an aspect of the present disclosure includes inspecting a defect of a mask by irradiating the mask in an inspection apparatus with extreme ultraviolet light generated by an extreme ultraviolet light generation apparatus, selecting a mask using a result of the inspection, and exposing and transferring a pattern formed on the selected mask onto a photosensitive substrate. Here, the extreme ultraviolet generation apparatus includes a chamber including a first space in which a target is irradiated with laser light to generate the extreme ultraviolet light, and a second space in which an EUV light concentrating mirror that reflects and outputs the extreme ultraviolet light to the inspection apparatus is arranged; a first partition wall including a first opening through which the extreme ultraviolet light passes and located between the first space and the second space; a connection portion which connects the chamber and the inspection apparatus; a second partition wall including a second opening through which the extreme ultraviolet light passes and located inside the connection portion; a gas supply port which allows a gas, to be supplied to the second space, to pass therethrough; a first exhaust port which opens to the first space; a second exhaust port which opens to a third space located inside the connection portion and between the second partition wall and the inspection apparatus; a sensor arranged in the third space; and a processor configured to calculate a first passage flow rate of a gas passing through the first opening based on a measurement result of the sensor and adjust a supply flow rate of the gas to be supplied through the gas supply port based on the first passage flow rate.

BRIEF DESCRIPTION OF THE DRAWINGS

Embodiments of the present disclosure will be described below merely as examples with reference to the accompanying drawings.

FIG. 7 shows a data table created in a first method in which a second passage flow rate is calculated based on the absolute value of a pressure difference.

DESCRIPTION OF EMBODIMENTS

<Contents>

Figure 1:
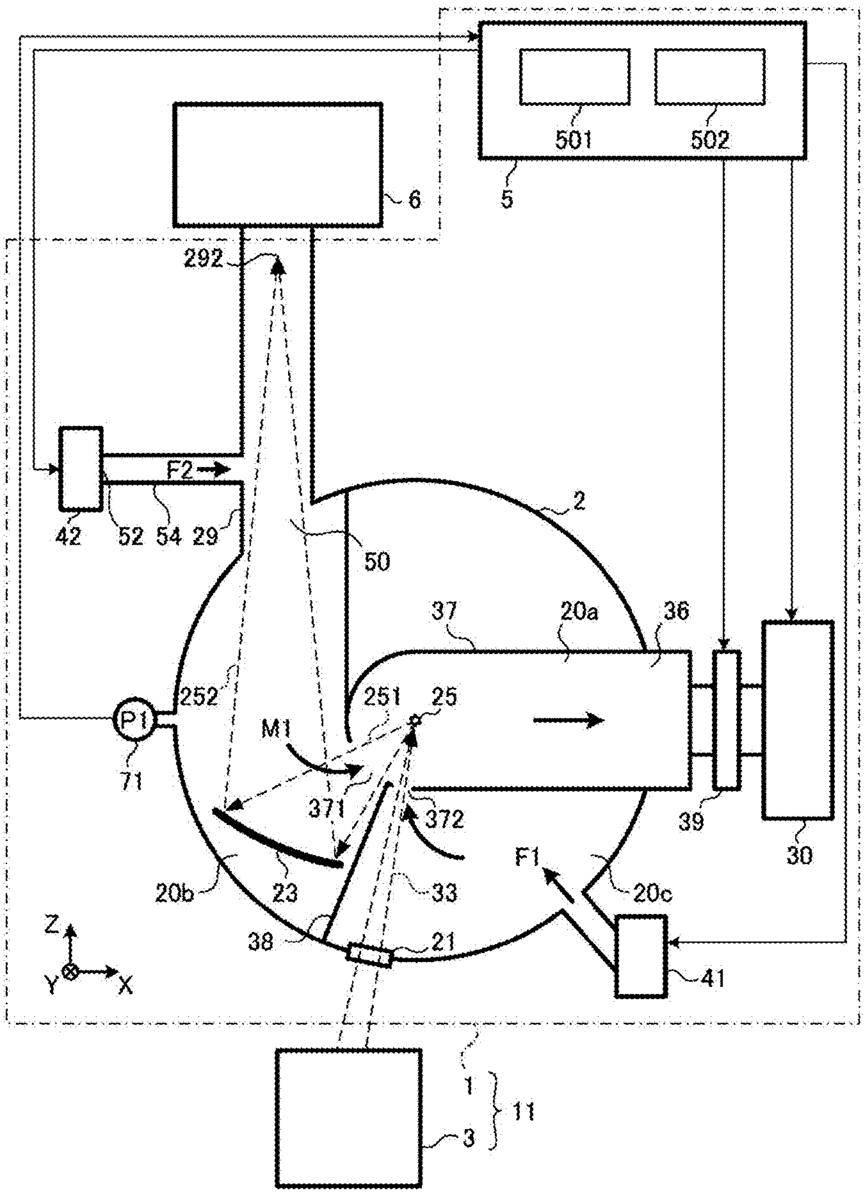
FIG. 1 shows the configuration of an LPP-type EUV light generation system according to a comparative example.

1. Comparative example
   1.1 Configuration
   1.2 Operation
2. Problem of comparative example
3. EUV light generation system 11*a* which controls supply flow rate F2 based on exhaust flow rate E1
   3.1 Configuration
   3.2 Operation
   3.3 Effect
4. EUV light generation system 11*b* which controls supply flow rate F2 based on pressure P2 in third space 910
   4.1 Configuration
   4.2 Operation
   4.3 Effect
5. Others
   5.1 Example of external apparatus 6
   5.2 Supplement Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numeral, and duplicate description thereof is omitted.

1. Comparative Example

1.1 Configuration

Figure 2:
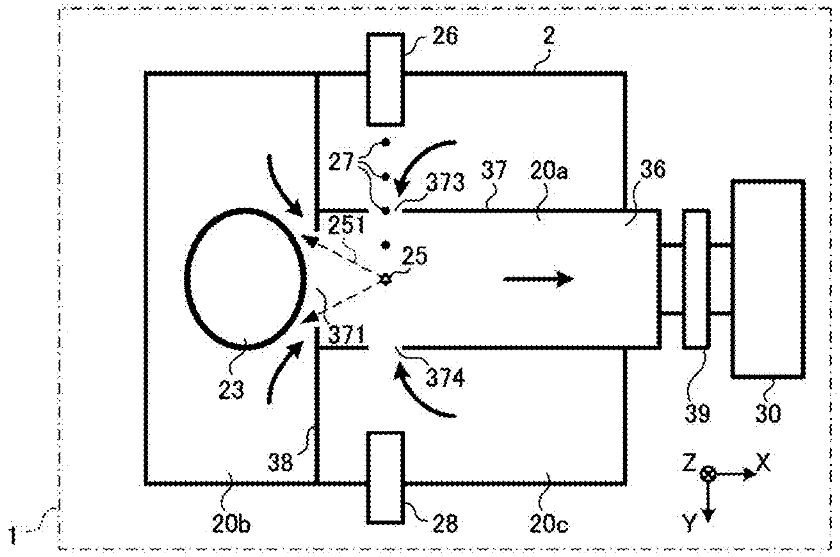
FIG. 2 shows the configuration of an light generation apparatus shown in FIG. 1.

FIG. 1 shows the configuration of an LPP-type EUV light generation system 11 according to a comparative example, and FIG. 2 shows the configuration of an EUV light generation apparatus 1 shown in FIG. 1. In FIGS. 1 and 2, the X direction, the Y direction, and the Z direction perpendicular to each other are shown. FIG. 1 is a view of the EUV light generation system 11 viewed in the Y direction, and FIG. 2 is a view of the EUV light generation apparatus 1 viewed in the Z direction. The Y direction is an output direction of a target 27, and the Z direction is an output direction of EUV light.

The EUV light generation apparatus 1 is used together with a laser device 3. In the present disclosure, a system including the EUV light generation apparatus 1 and the laser device 3 is referred to as the EUV light generation system 11. The EUV light generation apparatus 1 includes a chamber 2, an inner wall 37, and a first partition wall 38.

The chamber 2 is a sealable container and has a substantially cylindrical shape. The center axis of the cylindrical shape is parallel to the Y direction, and a target supply unit 26 and a target collection unit 28 are arranged at positions on the center axis. A plasma generation region 25 is located between the target supply unit 26 and the target collection unit 28. The internal space of the chamber 2 includes a first space 20*a*, a second space 20*b*, and a peripheral space 20*c*. The inner wall 37 and the first partition wall 38 are located between the first space 20*a* and the second space 20*b*.

The inner wall 37 has a cylindrical shape and penetrates the side surface of the chamber 2. The center axis of the cylindrical shape is parallel to the X direction. A part of the inner wall 37 is located inside the chamber 2 and is arranged to cover the plasma generation region 25. Another part of the inner wall 37 is located outside the chamber 2 and is connected to an exhaust device 30. The space inside the inner wall 37 and inside the chamber 2 is defined as the first space 20*a*. The first space 20*a* has a first exhaust port 36 inside the inner wall 37 and at a boundary with respect to the space outside the chamber 2. An exhaust valve 39 capable of adjusting the opening degree thereof is arranged between the first exhaust port 36 and the exhaust device 30.

The first partition wall 38 separates the space inside the chamber 2 and outside the inner wall 37 into the second space 20*b* and the peripheral space 20*c* surrounding the inner wall 37. The first partition wall 38 has a first opening 371.

Inside the chamber 2, the inner wall 37 has the first opening 371, a laser passage port 372, and target passage ports 373, 374. The first opening 371 of the inner wall 37 is identical to the first opening 371 of the first partition wall and is 38 configured to provide communication between the second space 20*b* and the first space 20*a*. The laser passage port 372 and the target passage ports 373, 374 are configured to provide communication between the peripheral space 20*c* and the first space 20*a*.

The target supply unit 26 supplies the target 27 containing a target substance into the chamber 2. The material of the target substance may include tin, terbium, gadolinium, lithium, xenon, or a combination of any two or more thereof.

A window 21 is arranged in the wall of the chamber 2. Pulse laser light 33 output from the laser device 3 passes through the window 21. The chamber 2 is connected to a first gas supply device 41 that supplies a gas at a flow rate F1 to the peripheral space 20*c*. The gas to be supplied is, for example, a hydrogen gas.

An EUV light concentrating mirror 23 having a spheroidal reflection surface is arranged in the second space 20*b*. A multilayer reflective film in which molybdenum and silicon are alternately laminated is formed on the reflection surface. The EUV light concentrating mirror 23 has first and second focal points. The EUV light concentrating mirror 23 is arranged such that the first focal point is located in a plasma generation region 25 and the second focal point is located at an intermediate focal point 292. A pressure P1 in the second space 20*b* is measured by a pressure sensor 71 arranged in the chamber 2. The pressure sensor 71 corresponds to the second sensor in the present disclosure. The exhaust device 30 is controlled so that the pressure P1 in the second space 20*b* falls within a target range. In the present disclosure, the target range of the pressure P1 may be referred to as a first target range.

The first opening 371 is located on the optical path of radiation light 251 including the EUV light generated at the plasma generation region 25 and directed toward the EUV light concentrating mirror 23. An EUV passage port 50 is located on the optical path of reflection light 252 directed toward the intermediate focal point 292 from the EUV light concentrating 23. The mirror EUV light concentrating mirror 23 is arranged such that the center axis of the optical path of the reflection light 252 is inclined with respect to the center axis of the optical path of the radiation light 251, and is configured to output the reflection light 252 to the external apparatus 6 via an optical path outside the first opening 371. The optical path outside the first opening 371 means an optical path that does not pass through the first opening 371.

The EUV light generation apparatus 1 includes a connection pipe 29 connecting the chamber 2 and a chamber of the external apparatus 6. The external apparatus 6 is an apparatus that performs a function by using the EUV light, and may be an exposure apparatus 6*a* shown in FIG. 8 or an inspection apparatus 6*b* shown in FIG. 9. A wall (not shown) in which an aperture is formed at the position of the intermediate focal point 292 may be provided in the connection pipe 29. A gas supply pipe 54 is connected to the connection pipe 29, and a second gas supply device 42 that supplies a gas having a supply flow rate F2 via a gas supply port 52 is connected to the gas supply pipe 54. The gas to be supplied is, for example, a hydrogen gas. The gas supplied from the second gas supply device 42 to the inside of the connection pipe 29 flows to the second space 20*b* via the EUV passage port 50.

The gas supply pipe 54 is not limited to being connected to the connection pipe 29, and may be connected to the chamber 2 to supply the gas to the second space 20*b*.

The EUV light generation apparatus 1 includes a target sensor (not shown) and a laser light transmission device (not shown). The target sensor detects at least one of the presence, trajectory, position, and velocity of the target 27. The target sensor may have an imaging function. The laser light transmission device is arranged between the laser device 3 and the chamber 2 and includes optical elements for defining a transmission state of the laser light 33, and an actuator for adjusting the position, posture, and the like of the optical elements.

The EUV light generation apparatus 1 further includes a processor 5. The processor 5 is a processing device including a memory 501 in which a control program is stored, and a central processing unit (CPU) 502 which executes the control program. The processor 5 is specifically configured or programmed to perform various processes included in the present disclosure. The processor 5 controls the entire EUV light generation system 11. The processor 5 processes the detection result of the target sensor, and controls timing at which the target 27 is output, an output direction of the target 27, and the like based on the detection result of the target sensor. Further, the processor 5 controls oscillation timing of the laser device 3, a travel direction of the laser light 33, a concentration position of the laser light 33, and the like.

1.2 Operation

The laser light 33 output from the laser device 3 enters the chamber 2 through the window 21. The laser light 33 passes through the laser passage port 372 and is guided to the plasma generation region 25.

The target 27 output from the target supply unit 26 passes through the target passage port 373 and reaches the plasma generation region 25. The target 27 is irradiated with the laser light 33. Among the plurality of targets 27, the targets 27 without being irradiated with the laser light 33 and without being turned into plasma pass through the plasma generation region 25, further pass through the target passage port 374, and reach the target collection unit 28.

The target 27 irradiated with the laser light 33 is turned into plasma, and the radiation light 251 is radiated from the plasma. The radiation light 251 passes through the first opening 371 and is incident on the EUV light concentrating mirror 23. The EUV light contained in the radiation light 251 is reflected by the EUV light concentrating mirror 23 with higher reflectance than light in other wavelength ranges. The reflection light 252 including the EUV light reflected by the EUV light concentrating mirror 23 is concentrated on the intermediate focal point 292 and output to the external apparatus 6. Here, one target 27 may be irradiated with a plurality of pulses included in the laser light 33. The plurality of pulses includes, for example, a prepulse and a main pulse.

The exhaust device 30 exhausts the gas in the first space 20*a* to the outside of the inner wall 37 and the outside of the chamber 2 via the exhaust valve 39. As a result, the pressure in the first space 20*a* is maintained lower than both the pressure in the peripheral space 20*c* and the pressure P1 in the second space 20*b*. Consequently, the gas flows from the second space 20*b* toward the first space 20*a* through the first opening 371, and the gas flows from the peripheral space 20*c* toward the first space 20*a* through each of the laser passage port 372 and the target passage ports 373, 374. Therefore, debris of the target substance generated at the vicinity of the plasma generation region 25 is suppressed from moving from the first space 20*a* to the peripheral space 20*c* and the second space 20*b*. Further, debris of the target substance is suppressed from being deposited on optical components such as the EUV light concentrating mirror 23 and the window 21.

2. Problem of Comparative Example

The pressure P1 in the second space 20*b* of the chamber 2 is, for example, around 100 Pa, and the pressure in the chamber of the external apparatus 6 is 10 Pa or less, for example, around 1 Pa. Therefore, in the comparative example, a part of the gas in the chamber 2 may flow into the chamber of the external apparatus 6. As an improvement of the comparative example, in order to reduce inflow of the gas into the chamber of the external apparatus 6, it is conceivable to arrange a differential evacuation device including a second exhaust port 61, which will be described later, in the connection pipe 29. In this improvement, a part of the gas in the chamber 2 is exhausted from the second exhaust port 61.

As described above, the gas supplied from the second gas supply device 42 not only flows out through the first opening 371 but also flows out to the external apparatus 6 in the comparative example, and flows out from the second exhaust port 61 in the improvement. Therefore, even when the supply flow rate F2 of the gas supplied from the second gas supply device 42 is known, it is difficult to know a first passage flow rate M1 of the gas passing through the first opening 371.

If the flow rate at the first exhaust port 36 is measured, it is possible to know the first passage flow rate M1 as well. However, since the gas passing through the first exhaust port 36 contains a large amount of debris of the target substance, the accuracy of the flow sensor is likely to be lowered, and accurate measurement is difficult.

Since the gas flowing from the second space 20*b* to the first space 20*a* through the first opening 371 suppresses debris of the target substance from moving from the first space 20*a* to the second space 20*b*, it is not preferable that the first passage flow rate M1 is too small. On the other hand, if the first passage flow rate M1 is too large, the trajectory of the target 27 becomes unstable because the flow rate of the gases in and around the plasma generation region 25 increases, and then generation of the EUV light may become unstable.

The embodiments described below relate to controlling the supply flow rate F2 of the gas to be supplied from the second gas supply device 42 so that the first passage flow rate M1 of the gas from the second space 20*b* to the first space 20*a* falls within an appropriate range.

3. EUV Light Generation System 11*a* which Controls Supply Flow Rate F2 Based on Exhaust Flow Rate E1

3.1 Configuration

Figure 3:
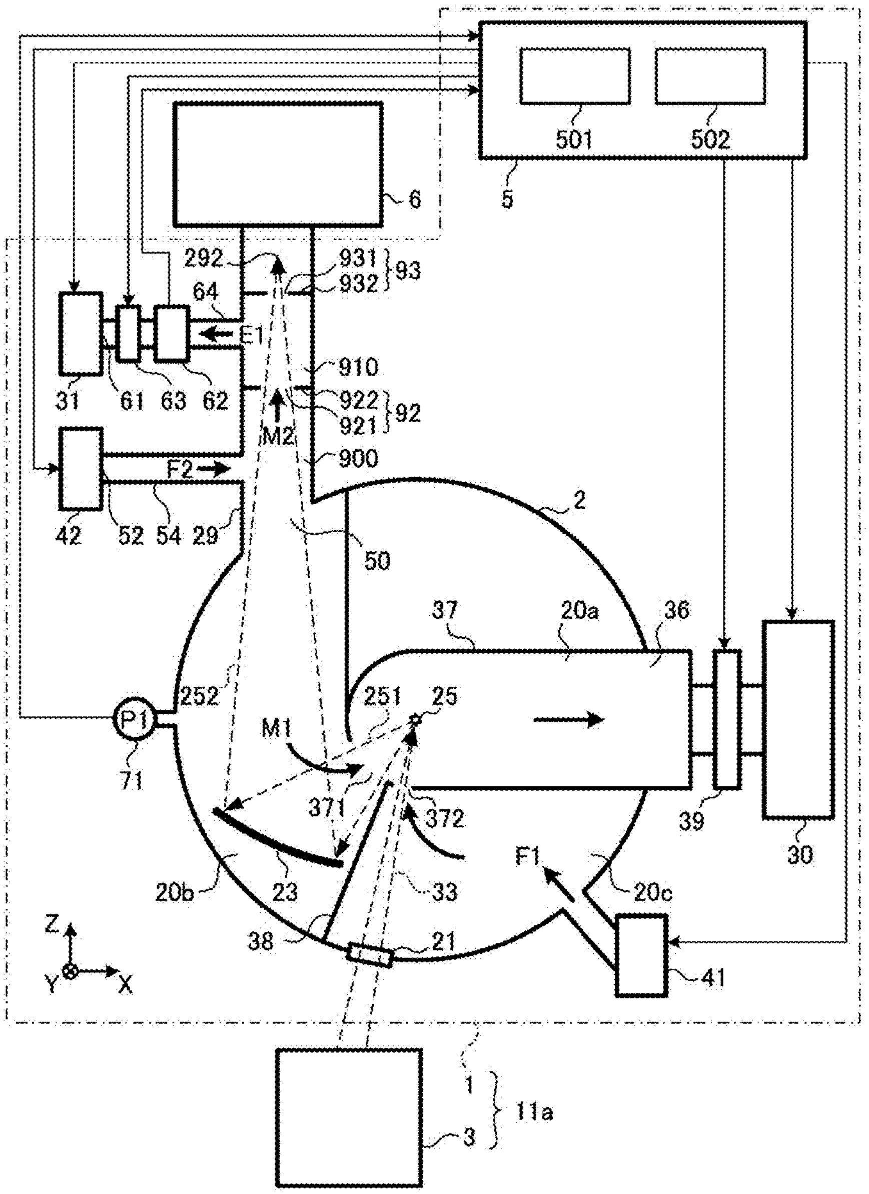
FIG. 3 shows the configuration of the EUV light generation system according to a first embodiment.

FIG. 3 shows the configuration of an EUV light generation system 11*a* according to a first embodiment. In the first embodiment, the differential evacuation device is arranged at a position of the connection pipe 29 between the intermediate focal point 292 and a portion connected to the gas supply pipe 54. The differential evacuation device includes a part of the connection pipe 29, second and third partition walls 92, 93 located inside the connection pipe 29, and an exhaust pipe 64 branched from the connection pipe 29 between the second and third partition walls 92, 93. The combination of the connection pipe 29 and the exhaust pipe 64 corresponds to the connection portion in the present disclosure.

The second partition wall 92 includes a second opening 921 through which the reflection light 252 passes and a partition plate 922 surrounding the second opening 921. The third partition wall 93 includes a third opening 931 smaller than the second opening 921 and a partition plate 932 surrounding the third opening 931, and is arranged such that the reflection light 252 having passed through the second opening 921 is output to the external apparatus 6 after passing through the third opening 931. An exhaust device 31 is connected to the exhaust pipe 64 via the second exhaust port 61. A flow rate sensor 62 and a valve 63 are arranged at the exhaust pipe 64 between the second exhaust port 61 and a portion connected to the connection pipe 29. The flow rate sensor 62 is an example of the first sensor in the present disclosure, and is configured to measure an exhaust flow rate E1 of the gas passing through the second exhaust port 61.

A space between the second partition wall 92 and the third partition wall 93 is defined as a third space 910, and a space between the EUV passage port 50 and the second partition wall 92 is defined as a fourth space 900. The third space 910 includes not only the inside of the connection pipe 29 but also the inside of the exhaust pipe 64 to which the second exhaust port 61 opens. By exhausting the gas in the third space 910 through the second exhaust port 61, the gas in the chamber 2 is suppressed from flowing into the chamber of the external apparatus 6. Although the third partition wall 93 is not an essential configuration in the present disclosure, the presence of the third partition wall 93 further suppresses the gas in the chamber 2 from flowing into the chamber of the external apparatus 6. The fourth space 900 includes not only the inside of the connection pipe 29 but also the inside of the gas supply pipe 54 to which the gas supply port 52 opens.

3.2 Operation

Figure 4:
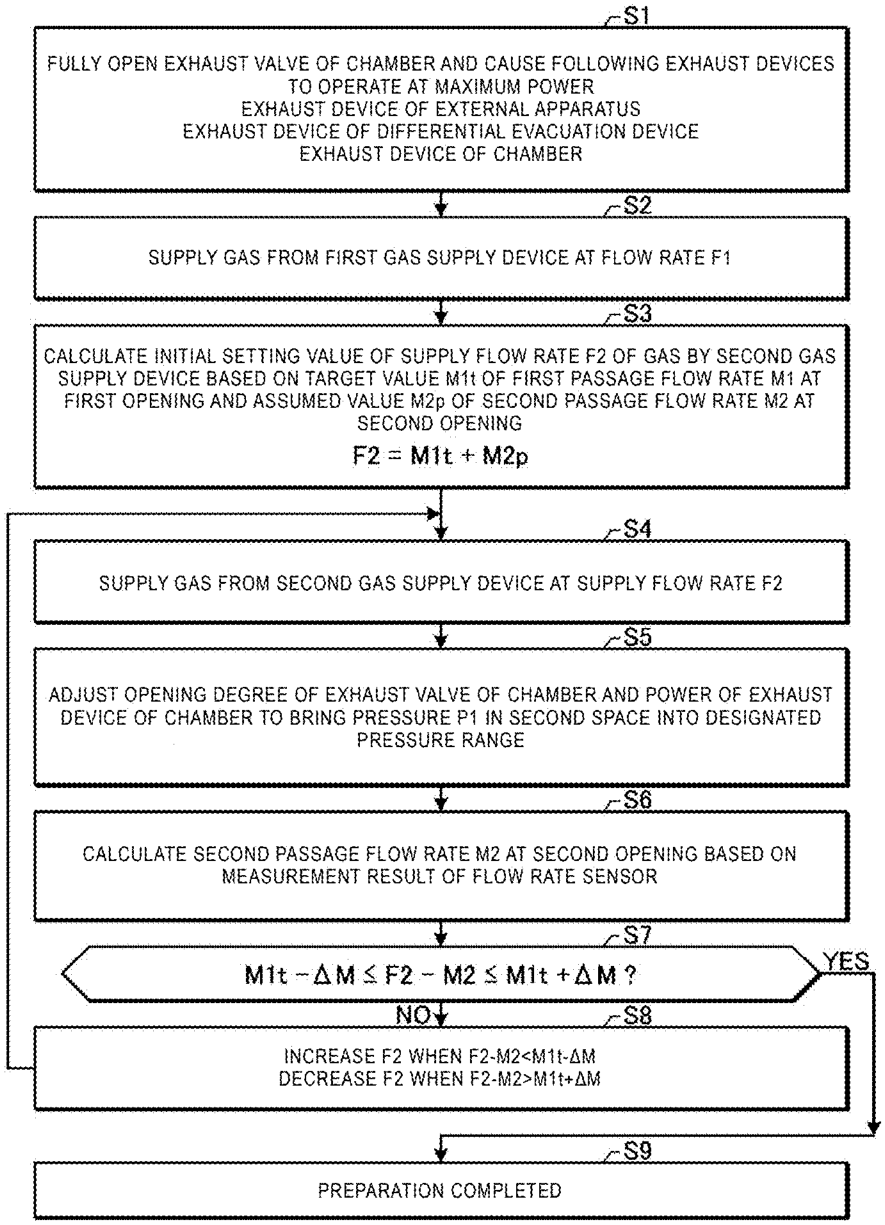
FIG. 4 is a flowchart showing operation of setting a supply flow rate of a gas in the first embodiment.

FIG. 4 is a flowchart showing operation of setting the supply flow rate F2 of the gas in the first embodiment. The operation shown in FIG. 4 is performed in a preparation stage for starting generation of the EUV light in the EUV light generation apparatus 1.

In S1, the processor 5 fully opens the exhaust valve 39 and causes the following exhaust devices to operate at maximum power.

- An exhaust device (not shown) of the external apparatus 6.
- The exhaust device 30 of the chamber 2
- The exhaust device 31 of the differential evacuation device The exhaust device of the external apparatus 6 may be controlled not by the processor 5 but by a processor (not shown) of the external apparatus 6.

In S2, the processor 5 controls the first gas supply device 41 so that the first gas supply device 41 starts supplying the gas at the flow rate F1.

In S3, the processor 5 calculates the initial setting value of the supply flow rate F2 of the gas by the second gas supply device 42 by the following expression.

$$F2=M1t+M2p$$

M1*t* is a target value of the first passage flow rate M1 of the gas at the first opening 371, and is set to a value that can suppress debris of the target substance from moving from the first space 20*a* to the second space 20*b* and the trajectory of the target 27 from becoming unstable. M2*p* is an assumed value of a second passage flow rate M2 of the gas at the second opening 921, and is calculated from the assumed value of the pressure difference between the second space 20*b* and the third space 910 and the size of the second opening 921.

In S4, the processor 5 controls the second gas supply device 42 so that the second gas supply device 42 starts supplying the gas at the supply flow rate F2.

In S5, the processor 5 adjusts the opening degree of the exhaust valve 39 and the power of the exhaust device 30 to bring the pressure P1 measured by the pressure sensor 71 into the target range. Alternatively, only one of the exhaust valve 39 and the exhaust device 30 may be adjusted. In the present disclosure, the process of S5 may be referred to as a first process.

In S6, the processor 5 calculates the second passage flow rate M2 at the second opening 921 based on the measurement result of the flow rate sensor 62. For example, assuming that the outflow of the gas from the third space 910 to the external apparatus 6 is negligibly small, the exhaust flow rate E1 measured by the flow rate sensor 62 can be set to the second passage flow rate M2 as it is. Alternatively, the outflow rate of the gas from the third space 910 to the external apparatus 6 may be calculated from the assumed pressure difference between the third space 910 and the external apparatus 6 and the size of the third opening 931, and the second passage flow rate M2 may be calculated by adding the outflow rate to the exhaust flow rate E1.

In S7, the processor 5 determines whether or not the value obtained by subtracting the second passage flow rate M2 from the supply flow rate F2, that is, the first passage flow rate M1 is within a target range. The upper limit of the target range of the first passage flow rate M1 is, for example, a value obtained by adding a positive number ΔM to the target value M1$t$, and the lower limit of the target range of the first passage flow rate M1 is, for example, a value obtained by subtracting the positive number ΔM from the target value M1$t$. In the present disclosure, the target range of the first passage flow rate M1 may be referred to as a second target range. When the first passage flow rate M1 is not within the target range (S7:NO), the processor 5 advances processing to S8. When the first passage flow rate M1 is within the target range (S7:YES), the processor 5 advances processing to S9.

In S8, the processor 5 increases the supply flow rate F2 when the first passage flow rate M1 is smaller than the lower limit of the target range, and decreases the supply flow rate F2 when the first passage flow rate M1 is larger than the upper limit of the target range. In the present disclosure, the processes of S6 to S8 may be referred to as a second process.

After S8, the processor 5 returns processing to S4 and continues adjustment using the new value of the supply flow rate F2 until the first passage flow rate M1 falls within the target range.

In S9, the processor 5 determines that the setting of the supply flow rate F2 has been completed, and ends processing of the present flowchart. Thereafter, output of the target 27 and output of the laser light 33 are started, and output of the EUV light is started.

3.3 Effect (1) According to the first embodiment, the EUV light generation apparatus 1 includes the chamber 2, the first partition wall 38, the connection portion including the connection pipe 29, the second partition wall 92, the gas supply port 52, the first exhaust port 36, the second exhaust port 61, the first sensor, and the processor 5. The chamber 2 includes the first space 20$a$ in which the target 27 is irradiated with the laser light 33 to generate EUV light, and the second space 20$b$ in which the EUV light concentrating mirror 23 that reflects and outputs the EUV light to the external apparatus 6 is arranged. The first partition wall 38 has the first opening 371 through which the EUV light passes, and is located between the first space 20$a$ and the second space 20$b$. The connection portion connects the chamber 2 and the external apparatus 6. The second partition wall 92 has the second opening 921 through which the EUV light passes, and is located inside the connection portion. The gas supply port 52 allows the gas, to be supplied to the second space 20$b$, to pass therethrough. The first exhaust port 36 opens to the first space 20$a$. The second exhaust port 61 opens to the third space 910 located inside the connection portion and between the second partition wall 92 and the external apparatus 6. The first sensor is arranged in the third space 910. The processor 5 calculates the first passage flow rate M1 of the gas passing through the first opening 371 based on the measurement result of the first sensor, and adjusts the supply flow rate F2 of the gas to be supplied through the gas supply port 52 based on the first passage flow rate M1.

Accordingly, since the first passage flow rate M1 of the gas passing through the first opening 371 can be calculated based on the measurement result of the first sensor arranged in the third space 910, the supply flow rate F2 can be adjusted so that the first passage flow rate M1 falls within an appropriate range. Therefore, it is possible to suppress debris of the target substance from moving to the second space 20$b$ through the first opening 371 and the trajectory of the target 27 from becoming unstable.

(2) According to the first embodiment, the first sensor is the flow rate sensor 62 for measuring the exhaust flow rate E1 of the gas passing through the second exhaust port 61, and the processor 5 calculates the first passage flow rate M1 based on the exhaust flow rate E1.

Accordingly, by using the exhaust flow rate E1 of the gas passing through the second exhaust port 61, the first passage flow rate M1 can be accurately calculated, and the supply flow rate F2 can be accurately adjusted.

(3) According to the first embodiment, the processor 5 calculates the second passage flow rate M2 of the gas passing through the second opening 921 based on the exhaust flow rate E1, and calculates the difference between the supply flow rate F2 and the second passage flow rate M2 as the first passage flow rate M1.

Accordingly, since the second passage flow rate M2 of the gas passing through the second opening 921 is calculated, the first passage flow rate M1 can be calculated more accurately.

(4) According to the first embodiment, the processor 5 calculates the difference between the supply flow rate F2 and the exhaust flow rate E1 as the first passage flow rate M1.

Accordingly, assuming that the amount of the gas flowing from the third space 910 to the external apparatus 6 is sufficiently small, the first passage flow rate M1 can be easily calculated assuming that the exhaust flow rate E1 is equal to the second passage flow rate M2.

(5) According to the first embodiment, the EUV light generation apparatus 1 includes the third partition wall 93 arranged between the third space 910 and the external apparatus 6, and the third partition wall 93 has the third opening 931, which is smaller than the second opening 921, through which the EUV light passes.

Accordingly, by configuring the differential evacuation device including the third partition wall 93, the amount of the gas flowing from the third space 910 to the external apparatus 6 can be limited, and the first passage flow rate M1 can be accurately calculated. Further, since the gas pressure in the third space 910 is maintained at a low pressure, loss due to absorption of the EUV light in the third space 910 can be suppressed.

(6) According to the first embodiment, the connection portion includes the connection pipe 29 through which the EUV light passes, and the exhaust pipe 64, branched from the connection pipe 29, connected to the second exhaust port 61, and including the flow rate sensor 62.

Accordingly, since the exhaust flow rate E1 is measured at the exhaust pipe 64 branched from the connection pipe 29, the exhaust flow rate E1 can be accurately measured.

(7) According to the first embodiment, the EUV light concentrating mirror 23 outputs the EUV light to the external apparatus 6 via the optical path outside the first opening 371.

Accordingly, since the first space 20$a$ in which debris of the target substance is generated is separated from the second, third, and fourth spaces 20$b$, 910, 900 including the optical path of the EUV light from the EUV light concentrating mirror 23 to the external apparatus 6, it is possible to suppress debris of the target substance from entering the second, third, and fourth spaces 20$b$, 910, 900.

(8) According to the first embodiment, the processor 5 decreases the supply flow rate F2 when the first passage flow rate M1 is larger than the upper limit M1$t$+ΔM of the target range, and increases the supply flow rate F2 when the first passage flow rate M1 is smaller than the lower limit M1$t$-ΔM of the target range.

Accordingly, the supply flow rate F2 can be adjusted so that the first passage flow rate M1 falls within the target range.

(9) According to the first embodiment, the EUV light generation apparatus 1 includes the exhaust device 30 connected to the first exhaust port 36 and the pressure sensor 71 that measures the pressure P1 in the second space 20*b*. The processor 5 controls the exhaust device 30 so that the pressure P1 in the second space 20*b* falls within the target range, then calculates the first passage flow rate M1 based on the measurement result of the flow rate sensor 62, and adjusts the supply flow rate F2 based on the first passage flow rate M1.

When the pressure P1 in the second space 20*b* changes, the first passage flow rate M1 of the gas passing through the first opening 371 may change. Both the pressure P1 in the second space 20*b* and the first passage flow rate M1 may be controlled within the target ranges respectively by adjusting the supply flow rate F2 based on the first passage flow rate M1 calculated after the pressure P1 in the second space 20*b* is brought into the target range.

(10) According to the first embodiment, the EUV light generation apparatus 1 includes the exhaust device 30 connected to the first exhaust port 36 and the pressure sensor 71 that measures the pressure P1 in the second space 20*b*. The processor 5 alternately performs, until the first passage flow rate M1 falls within the second target range, the process of S5 of controlling the exhaust device 30 so that the pressure P1 in the second space 20*b* falls within the first target range and the processes of S6 to S8 of calculating the first passage flow rate M1 based on the measurement result of the flow rate sensor 62, decreasing the supply flow rate F2 when the first passage flow rate M1 is larger than the upper limit M1$t$+ΔM of the second target range, and increasing the supply flow rate F2 when the first passage flow rate M1 is smaller than the lower limit M1$t$−ΔM of the second target range.

When the supply flow rate F2 changes, the pressure P1 in the second space 20*b* may change. By alternately performing the process of S5 and the processes of S6 to S8, both the pressure P1 in the second space 20*b* and the first passage flow rate M1 can be controlled within the target ranges respectively.

(11) According to the first embodiment, the EUV light generation apparatus 1 includes the exhaust device 30 connected to the first exhaust port 36, the exhaust valve 39 arranged between the first exhaust port 36 and the exhaust device 30, and the pressure sensor 71 that measures the pressure P1 in the second space 20*b*. The processor 5 controls the opening degree of the exhaust valve 39 so that the pressure P1 in the second space 20*b* falls within the target range, then calculates the first passage flow rate M1 based on the measurement result of the flow rate sensor 62, and adjusts the supply flow rate F2 based on the first passage flow rate M1.

Accordingly, since the flow rate of the exhausted gas is adjusted by the opening degree of the exhaust valve 39, the pressure P1 in the second space 20*b* can be accurately controlled.

(12) According to the first embodiment, the EUV light generation apparatus 1 includes the exhaust device 30 connected to the first exhaust port 36, the exhaust valve 39 arranged between the first exhaust port 36 and the exhaust device 30, and the pressure sensor 71 that measures the pressure P1 in the second space 20*b*. The processor 5 alternately performs, until the first passage flow rate M1 falls within the second target range, the process of S5 of controlling the opening degree of the exhaust valve 39 so that the pressure P1 in the second space 20*b* falls within the first target range and the processes of S6 to S8 of calculating the first passage flow rate M1 based on the measurement result of the flow rate sensor 62, decreasing the supply flow rate F2 when the first passage flow rate M1 is larger than the upper limit M1$t$+ΔM of the second target range, and increasing the supply flow rate F2 when the first passage flow rate M1 is smaller than the lower limit M1$t$−ΔM of the second target range.

Accordingly, by alternately performing the process of S5 and the processes of S6 to S8, both the pressure P1 in the second space 20*b* and the first passage flow rate M1 can be controlled within the target ranges respectively.

(13) According to the first embodiment, the gas supply port 52 opens to the fourth space 900 located inside the connection portion and between the second partition wall 92 and the chamber 2.

Accordingly, since the gas flow from the fourth space 900 to the second space 20*b* can be generated, it is possible to suppress debris from reaching the fourth space 900 even when debris of the target substance is mixed into the second space 20*b*.

In other respects, the first embodiment is similar to the comparative example.

4. EUV Light Generation System 11*b* which Controls Supply Flow Rate F2 Based on Pressure P2 in Third Space 910

4.1 Configuration

Figure 5:
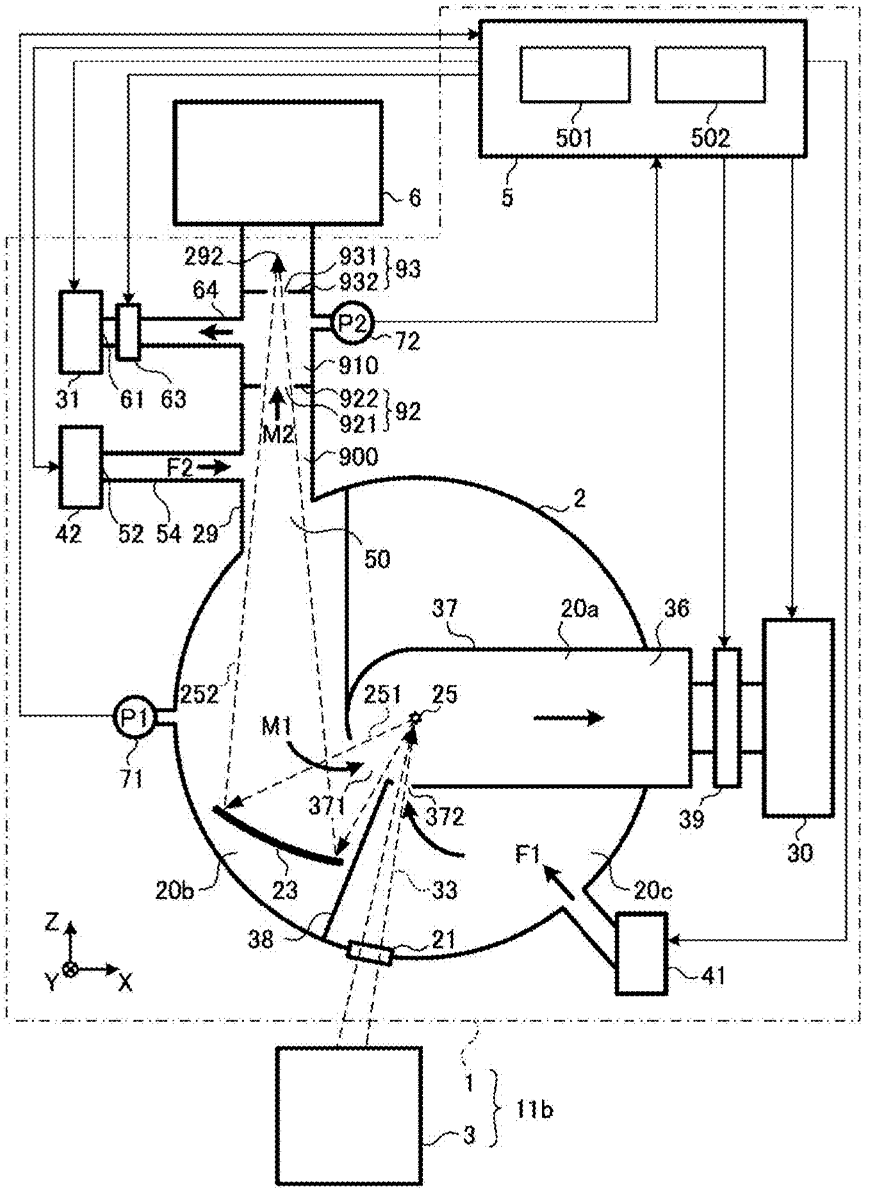
FIG. 5 shows the configuration of the EUV light generation system according to a second embodiment.

FIG. 5 shows the configuration of an EUV light generation system 11*b* according to a second embodiment. In the second embodiment, a pressure sensor 72 is connected to the connection pipe 29. The pressure sensor 72 is an example of the first sensor in the present disclosure, and is configured to measure a pressure P2 in the third space 910. The flow rate sensor 62 provided at the exhaust pipe 64 in the first embodiment may be omitted in the second embodiment.

4.2 Operation

Figure 6:
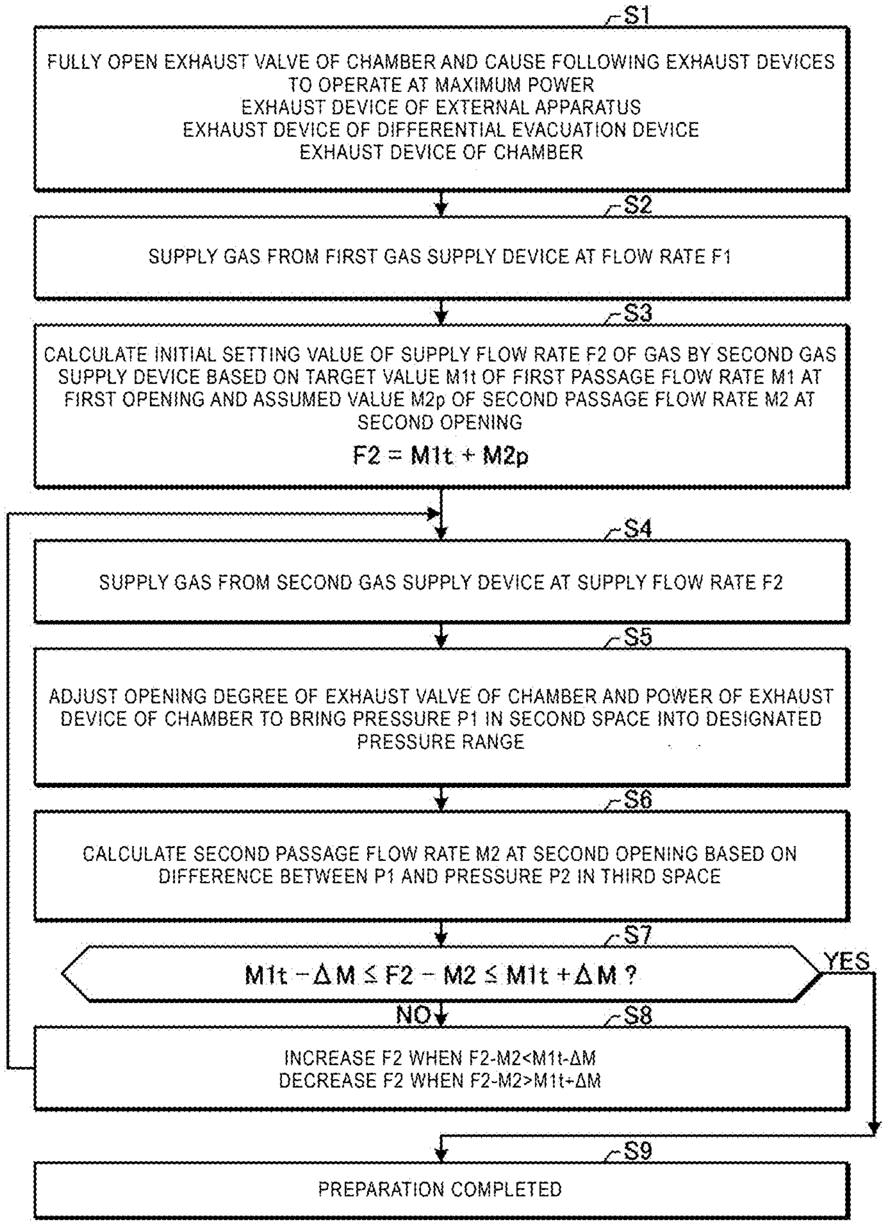
FIG. 6 is a flowchart showing operation of setting the supply flow rate of the gas in the second embodiment.

FIG. 6 is a flowchart showing operation of setting the supply flow rate F2 of the gas in the second embodiment. The processes of S1 to S5 and S7 to S9 are similar to those of the first embodiment.

In S6, the processor 5 calculates the second passage flow rate M2 at the second opening 921 based on an absolute value ΔP of the pressure difference between the pressure P1 in the second space 20*b* measured by the pressure sensor 71 and the pressure P2 in the third space 910 measured by the pressure sensor 72. As a method of calculating the second passage flow rate M2 based on the absolute value ΔP of the pressure difference, there are a first method using a result measured in advance and a second method in which theoretical calculation is performed.

FIG. 7 shows a data table created in the first method in which the second passage flow rate M2 is calculated based on the absolute value ΔP of the pressure difference. The data table is stored in a storage medium such as the memory 501, and indicates the relationship between the absolute value ΔP and the second passage flow rate M2. Theoretically, since the second passage flow rate M2 is proportional to the positive square root of the absolute value ΔP, the absolute value ΔP and the second passage flow rate M2 are in a one-to-one correspondence.

The second passage flow rate M2 is measured as follows. In the EUV light generation system 11*b*, the supply flow rate F2 of the gas by the second gas supply device 42 is changed under a state in which the exhaust valve 39 is closed, the supply of the gas by the first gas supply device 41 is stopped, the exhaust device (not shown) of the external apparatus 6 is stopped, and the exhaust device 31 is operated. Since the second passage flow rate M2 at this time is equal to the supply flow rate F2, the second passage flow rate M2 is known if the supply flow rate F2 can be known. Alternatively, since the second passage flow rate M2 is equal to the exhaust flow rate E1 described in the first embodiment, the measurement value of the flow rate sensor 62 described in the first embodiment may be set as the second passage flow rate M2.

By measuring the second passage flow rate M2 while changing the supply flow rate F2 in this manner and measuring the absolute value ΔP, it is possible to create the data table as shown in FIG. 7. In S6 of FIG. 6, the second passage flow rate M2 can be calculated by reading the value of the second passage flow rate M2 corresponding to the calculated value of the absolute value ΔP and performing interpolation calculation as needed.

In the second method of calculating the second passage flow rate M2 based on the absolute value ΔP of the pressure difference, a value proportional to the positive square root of the absolute value ΔP is calculated. Specifically, the second passage flow rate M2 is calculated as $C\times A\times(2\times\Delta P/\rho)^{1/2}$ using the absolute value ΔP, a flow rate coefficient C, a cross-sectional area A of the second opening 921, and a fluid density ρ of the gas passing through the second opening 921.

In the second method, C×A of the above-described expression may be obtained using the measurement result described with reference to FIG. 7. In this case, a specific value of each of the flow rate coefficient C and the cross-sectional area A is unnecessarily.

4.3 Effect

(14) According to the second embodiment, the EUV light generation apparatus 1 includes the pressure sensor 71 for measuring the pressure P1 in the second space 20*b* and the pressure sensor 72 for measuring the pressure P2 in the third space 910. The processor 5 calculates the first passage flow rate M1 based on the measurement results of the pressure sensors 71, 72.

Accordingly, by using the measurement results of the pressure sensors 71, 72, the first passage flow rate M1 can be accurately calculated. Further, since the flow rate sensor 62 is not required to be provided at the exhaust pipe 64, a decrease in the exhaust capacity can be suppressed.

(15) According to the second embodiment, the processor 5 calculates the second passage flow rate M2 of the gas passing through the second opening 921 based on the measurement results of the pressure sensors 71, 72, and calculates the difference between the supply flow rate F2 and the second passage flow rate M2 as the first passage flow rate M1.

Accordingly, since the second passage flow rate M2 of the gas passing through the second opening 921 is calculated, the first passage flow rate M1 can be calculated more accurately.

(16) According to the second embodiment, the EUV light generation apparatus 1 includes the storage medium storing the data table indicating the relationship between the absolute value ΔP of the pressure difference between the second and third spaces 20*b*, 910 and the second passage flow rate M2. The processor 5 calculates the absolute value ΔP based on the measurement results of the pressure sensors 71, 72, and calculates the second passage flow rate M2 based on the absolute value ΔP and the data table.

Accordingly, by using the data table, the second passage flow rate M2 can be calculated easily.

(17) According to the second embodiment, the processor 5 calculates the absolute value ΔP of the pressure difference between the second and third spaces 20*b*, 910 based on the measurement results of the pressure sensors 71, 72, and calculates a value proportional to the positive square root of the absolute value ΔP as the second passage flow rate M2.

Accordingly, by setting the value proportional to the positive square root of the absolute value ΔP of the pressure difference as the second passage flow rate M2, a theoretically accurate second passage flow rate M2 can be calculated.

(18) According to the second embodiment, the processor 5 calculates the absolute value ΔP of the pressure difference between the second and third spaces 20*b*, 910 based on the measurement results of the pressure sensors 71, 72, and calculates the value obtained by $C\times A\times(2\times\Delta P/\rho)^{1/2}$ as the second passage flow rate M2 using the absolute value ΔP, the flow rate coefficient C, the cross-sectional area A of the second opening 921, and the fluid density ρ of the gas passing through the second opening 921.

Accordingly, the second passage flow rate M2 can be calculated by theoretical calculation using the pressure difference.

In other respects, the second embodiment is similar to the first embodiment.

5. Others

5.1 Example of External Apparatus 6

Figure 8:
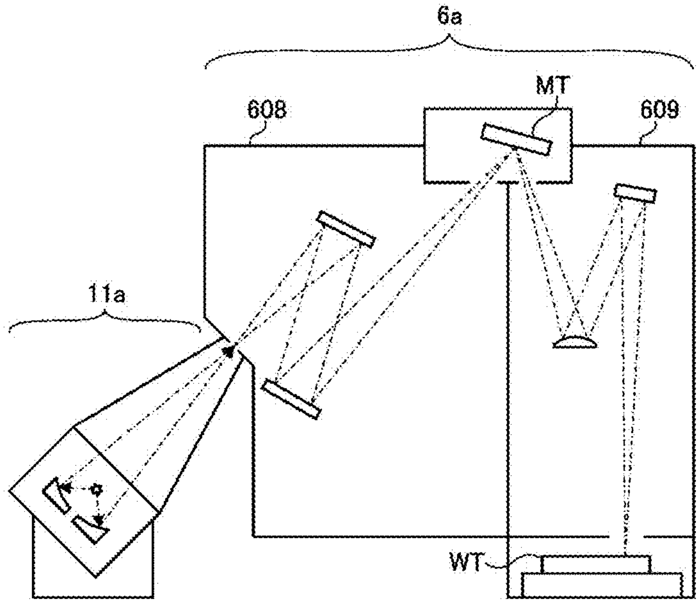
FIG. 8 schematically shows the configuration of an exposure apparatus connected to the EUV light generation system.

FIG. 8 schematically shows the configuration of the exposure apparatus 6*a* connected to the EUV light generation system 11*a*. In FIG. 8, the exposure apparatus 6*a* as the external apparatus 6 (see FIG. 1) includes a mask irradiation unit 608 and a workpiece irradiation unit 609. The mask irradiation unit 608 illuminates, via a reflection optical system, a mask pattern of a mask table MT with the EUV light incident from the EUV light generation system 11*a*. The workpiece irradiation unit 609 images the EUV light reflected by the mask table MT onto a workpiece (not shown) arranged on a workpiece table WT via the reflection optical system. The workpiece is a photosensitive substrate such as a semiconductor wafer on which photoresist is applied. The exposure apparatus 6*a* synchronously translates the mask table MT and the workpiece table WT to expose the workpiece to the EUV light reflecting the mask pattern. Through the exposure process as described above, a device pattern is transferred onto the semiconductor wafer, thereby an electronic device can be manufactured.

Figure 9:
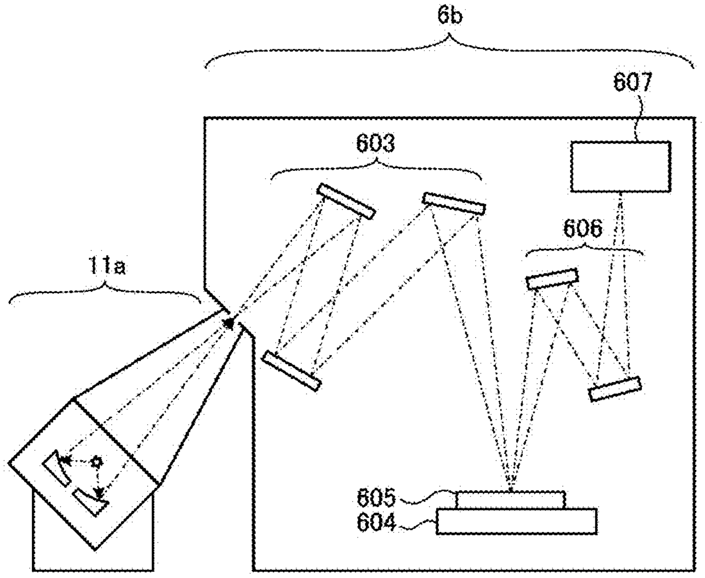
FIG. 9 schematically shows the configuration of an inspection apparatus connected to the EUV light generation system.

FIG. 9 schematically shows the configuration of the inspection apparatus 6*b* connected to the EUV light generation system 11*a*. In FIG. 9, the inspection apparatus 6*b* as the external apparatus 6 (see FIG. 1) includes an illumination optical system 603 and a detection optical system 606. The illumination optical system 603 reflects the EUV light incident from the EUV light generation system 11*a* to illuminate a mask 605 placed on a mask stage 604. Here, the mask 605 conceptually includes a mask blanks before a pattern is formed. The detection optical system 606 reflects the EUV light from the illuminated mask 605 and forms an image on a light receiving surface of a detector 607. The detector 607 having received the EUV light obtains the image of the mask 605. The detector 607 is, for example, a time delay integration (TDI) camera. A defect of the mask 605 is inspected based on the image of the mask 605 acquired by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 6*a*.

Although FIGS. 8 and 9 show the EUV light generation system 11*a* according to the first embodiment, the EUV light generation system 11*b* according to the second embodiment may be used.

5.2 Supplement

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that the embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation apparatus comprising:

a chamber including a first space in which a target is irradiated with laser light to generate extreme ultraviolet light, and a second space in which an EUV light concentrating mirror that reflects and outputs the extreme ultraviolet light to an external apparatus is arranged;

a first partition wall including a first opening through which the extreme ultraviolet light passes and located between the first space and the second space;

a connection portion which connects the chamber and the external apparatus;

a second partition wall including a second opening through which the extreme ultraviolet light passes and located inside the connection portion;

a gas supply port which allows a gas, to be supplied to the second space, to pass therethrough;

a first exhaust port which opens to the first space;

a second exhaust port which opens to a third space located inside the connection portion and between the second partition wall and the external apparatus;

a first sensor arranged in the third space; and a processor configured to calculate a first passage flow rate of a gas passing through the first opening based on a measurement result of the first sensor and adjust a supply flow rate of the gas to be supplied through the gas supply port based on the first passage flow rate.

2. The extreme ultraviolet light generation apparatus according to claim 1, wherein the first sensor is a flow rate sensor configured to measure an exhaust flow rate of a gas passing through the second exhaust port, and the processor calculates the first passage flow rate based on the exhaust flow rate.

3. The extreme ultraviolet light generation apparatus according to claim 2, wherein the processor calculates a second passage flow rate of a gas passing through the second opening based on the exhaust flow rate, and calculates a difference between the supply flow rate and the second passage flow rate as the first passage flow rate.

4. The extreme ultraviolet light generation apparatus according to claim 2, wherein the processor calculates a difference between the supply flow rate and the exhaust flow rate as the first passage flow rate.

5. The extreme ultraviolet light generation apparatus according to claim 4, further comprising a third partition wall including a third opening, smaller than the second opening, through which the extreme ultraviolet light passes, and arranged between the third space and the external apparatus.

6. The extreme ultraviolet light generation apparatus according to claim 2, wherein the connection portion includes a connection pipe through which the extreme ultraviolet light passes, and an exhaust pipe, branched from the connection pipe, connected to the second exhaust port, and including the flow rate sensor.

7. The extreme ultraviolet light generation apparatus according to claim 1, wherein the EUV light concentrating mirror outputs the extreme ultraviolet light to the external apparatus via an optical path outside the first opening.

8. The extreme ultraviolet light generation apparatus according to claim 1, wherein the processor decreases the supply flow rate when the first passage flow rate is larger than an upper limit of a target range, and increases the supply flow rate when the first passage flow rate is smaller than a lower limit of the target range.

9. The extreme ultraviolet light generation apparatus according to claim 1, further comprising:

an exhaust device connected to the first exhaust port; and a second sensor which is a pressure sensor configured to measure a pressure in the second space, wherein the processor controls the exhaust device so that the pressure in the second space falls within a target range, then calculates the first passage flow rate based on the measurement result of the first sensor, and adjusts the supply flow rate based on the first passage flow rate.

10. The extreme ultraviolet light generation apparatus according to claim 1, further comprising:

an exhaust device connected to the first exhaust port; and a second sensor which is a pressure sensor configured to measure a pressure in the second space, wherein the processor alternately performs, until the first passage flow rate falls within a second target range, a first process of controlling the exhaust device so that the pressure in the second space falls within a first target range and a second process of calculating the first passage flow rate based on the measurement result of the first sensor, decreasing the supply flow rate when the first passage flow rate is larger than an upper limit of the second target range, and increasing the supply flow rate when the first passage flow rate is smaller than a lower limit of the second target range.

11. The extreme ultraviolet light generation apparatus according to claim 1, further comprising:

an exhaust device connected to the first exhaust port;

an exhaust valve arranged between the first exhaust port and the exhaust device; and a second sensor which is a pressure sensor configured to measure a pressure in the second space, wherein the processor controls an opening degree of the exhaust valve so that the pressure in the second space falls within a target range, then calculates the first passage flow rate based on the measurement result of the first sensor, and adjusts the supply flow rate based on the first passage flow rate.

12. The extreme ultraviolet light generation apparatus according to claim 1, further comprising:

an exhaust device connected to the first exhaust port;

an exhaust valve arranged between the first exhaust port and the exhaust device; and a second sensor which is a pressure sensor configured to measure a pressure in the second space, wherein the processor alternately performs, until the first passage flow rate falls within a second target range, a first process of controlling an opening degree of the exhaust valve so that the pressure in the second space falls within a first target range and a second process of calculating the first passage flow rate based on the measurement result of the first sensor, decreasing the supply flow rate when the first passage flow rate is larger than an upper limit of the second target range, and increasing the supply flow rate when the first passage flow rate is smaller than a lower limit of the second target range.

13. The extreme ultraviolet light generation apparatus according to claim 1, wherein the gas supply port opens to a fourth space located inside the connection portion and between the second partition wall and the chamber.

14. The extreme ultraviolet light generation apparatus according to claim 1, further comprising a second sensor which is a pressure sensor configured to measure a pressure in the second space, wherein the first sensor is a pressure sensor configured to measure a pressure in the third space, and the processor calculates the first passage flow rate based on measurement results of the first and second sensors.

15. The extreme ultraviolet light generation apparatus according to claim 14, wherein the processor calculates a second passage flow rate of a gas passing through the second opening based on the measurement results of the first and second sensors, and calculates a difference between the supply flow rate and the second passage flow rate as the first passage flow rate.

16. The extreme ultraviolet light generation apparatus according to claim 15, further comprising a storage medium storing a data table indicating a relationship between an absolute value of a pressure difference between the second and third spaces and the second passage flow rate, wherein the processor calculates the absolute value based on the measurement results of the first and second sensors, and calculates the second passage flow rate based on the absolute value and the data table.

17. The extreme ultraviolet light generation apparatus according to claim 15, wherein the processor calculates an absolute value of a pressure difference between the second and third spaces based on the measurement results of the first and second sensors, and calculates a value proportional to a positive square root of the absolute value as the second passage flow rate.

18. The extreme ultraviolet light generation apparatus according to claim 15, wherein the processor calculates an absolute value ΔP of a pressure difference between the second and third spaces based on the measurement results of the first and second sensors, and calculates a value obtained by $C \times A \times (\times \Delta P/\rho)^{1/2}$ as the second passage flow rate using the absolute value ΔP, a flow rate coefficient C, a cross-sectional area A of the second opening, and a fluid density ρ of the gas passing through the second opening.

19. An electronic device manufacturing method, comprising:

generating extreme ultraviolet light using an extreme ultraviolet light generation apparatus;

outputting extreme ultraviolet light to an exposure apparatus; and exposing a photosensitive substrate to the extreme ultraviolet light in the exposure apparatus to manufacture an electronic device, the extreme ultraviolet light generation apparatus including:

a chamber including a first space in which a target is irradiated with laser light to generate the extreme ultraviolet light, and a second space in which an EUV light concentrating mirror that reflects and outputs the extreme ultraviolet light to the exposure apparatus is arranged;

a first partition wall including a first opening through which the extreme ultraviolet light passes and located between the first space and the second space;

a connection portion which connects the chamber and the exposure apparatus;

a second partition wall including a second opening through which the extreme ultraviolet light passes and located inside the connection portion;

a gas supply port which allows a gas, to be supplied to the second space, to pass therethrough;

a first exhaust port which opens to the first space;

a second exhaust port which opens to a third space located inside the connection portion and between the second partition wall and the exposure apparatus;

a sensor arranged in the third space; and a processor configured to calculate a first passage flow rate of a gas passing through the first opening based on a measurement result of the sensor and adjust a supply flow rate of the gas to be supplied through the gas supply port based on the first passage flow rate.

20. An electronic device manufacturing method, comprising:

inspecting a defect of a mask by irradiating the mask in an inspection apparatus with extreme ultraviolet light generated by an extreme ultraviolet light generation apparatus;

selecting a mask using a result of the inspection; and exposing and transferring a pattern formed on the selected mask onto a photosensitive substrate, the extreme ultraviolet generation apparatus including:

a chamber including a first space in which a target is irradiated with laser light to generate the extreme ultraviolet light, and a second space in which an EUV light concentrating mirror that reflects and outputs the extreme ultraviolet light to the inspection apparatus is arranged;

a first partition wall including a first opening through which the extreme ultraviolet light passes and located between the first space and the second space;

a connection portion which connects the chamber and the inspection apparatus;

a second partition wall including a second opening through which the extreme ultraviolet light passes and located inside the connection portion;

a gas supply port which allows a gas, to be supplied to the second space, to pass therethrough;

a first exhaust port which opens to the first space;

a second exhaust port which opens to a third space located inside the connection portion and between the second partition wall and the inspection apparatus;

a sensor arranged in the third space; and a processor configured to calculate a first passage flow rate of a gas passing through the first opening based on a measurement result of the sensor and adjust a supply flow rate of the gas to be supplied through the gas supply port based on the first passage flow rate.

* * * * *